(12) United States Patent
Zhang et al.

(10) Patent No.: US 11,971,435 B2
(45) Date of Patent: Apr. 30, 2024

(54) SYSTEM AND METHOD FOR IDENTIFYING PRODUCT INFORMATION

(71) Applicant: OPPLE LIGHTING CO., LTD., Shanghai (CN)

(72) Inventors: Guoping Zhang, Shanghai (CN); Jian Zhu, Shanghai (CN); Wen Yang, Shanghai (CN); Jiachun Cun, Shanghai (CN)

(73) Assignee: OPPLE LIGHTING CO., LTD., Shanghai (CN)

( * ) Notice: Subject to any disclaimer, the term of this patent is extended or adjusted under 35 U.S.C. 154(b) by 587 days.

(21) Appl. No.: 17/137,676

(22) Filed: Dec. 30, 2020

(65) Prior Publication Data

US 2021/0116482 A1     Apr. 22, 2021

Related U.S. Application Data

(63) Continuation of application No. PCT/CN2019/118591, filed on Nov. 14, 2019.

(30) Foreign Application Priority Data

Nov. 15, 2018 (CN) .......................... 201811358895.0

(51) Int. Cl.
*G01R 19/25* (2006.01)
*G01R 22/10* (2006.01)
(Continued)

(52) U.S. Cl.
CPC ..... *G01R 19/2509* (2013.01); *G01R 19/2516* (2013.01); *G01R 22/10* (2013.01);
(Continued)

(58) Field of Classification Search
CPC ............ G01R 31/2825; G01R 19/2509; G16Y 20/30; H05B 47/135; H05B 47/10; H05B 47/19
See application file for complete search history.

(56) References Cited

FOREIGN PATENT DOCUMENTS

| CN | 102067734 A | 5/2011 |
|----|-------------|--------|
| CN | 202048538 U | 11/2011 |

(Continued)

OTHER PUBLICATIONS

English Translation of Written Opinion issued in PCT/CN2019/118591, dated May 15, 2021, 6 pages (Year: 2021).*

(Continued)

*Primary Examiner* — Mischita L Henson
(74) *Attorney, Agent, or Firm* — Arch & Lake LLP

(57) ABSTRACT

The present disclosure relates to a system for automatically identifying product information, including a lamp information collection module, a controller, and a user terminal. The controller has a built-in comparison table setting different power information intervals for different lamp categories, and sends to-be-collected power information to the lamp information collection module. The lamp information collection module is used to collect corresponding power information according to the received to-be-collected power information and send the collected power information to the controller. The controller is further used to determine a category of a lamp according to the collected power information corresponding to the lamp and the power information interval comparison table, and send information of the lamp to the user terminal. The user terminal includes a human-machine interface and is used to display the information of the lamp on the human-machine interface.

10 Claims, 1 Drawing Sheet

(51) Int. Cl.
*G01R 31/28* (2006.01)
*G06F 3/04817* (2022.01)
*G16Y 20/20* (2020.01)
*G16Y 20/30* (2020.01)
*G16Y 40/30* (2020.01)
*H05B 47/19* (2020.01)

(52) U.S. Cl.
CPC ..... *G01R 31/2825* (2013.01); *G06F 3/04817* (2013.01); *G16Y 20/20* (2020.01); *G16Y 20/30* (2020.01); *G16Y 40/30* (2020.01); *H05B 47/19* (2020.01)

(56) References Cited

FOREIGN PATENT DOCUMENTS

| | | | |
|---|---|---|---|
| CN | 102595747 A | | 7/2012 |
| CN | 103391677 A | | 11/2013 |
| CN | 203745721 U | | 7/2014 |
| CN | 204241667 U | * | 4/2015 |
| CN | 207766616 U | | 8/2018 |
| CN | 109561551 A | | 4/2019 |
| CN | 115835463 B | * | 9/2023 ............ Y02B 20/40 |
| JP | 2014235967 A | | 12/2014 |
| KR | 20120138753 A | * | 12/2012 |
| WO | WO-2019109893 A1 | * | 6/2019 |

OTHER PUBLICATIONS

G.M. Soares et al., Detection of Street Lighting Bulbs Information to Minimize Commercial Losses, 2013, 2013 Seventh International Conference on Sensing Technology, IEEE, pp. 895-900 (Year: 2013).*

B. Mishra et al., A novel efficient design of Intelligent Street Lighting monitoring system using ZigBee network of devices and sensors on Embedded Internet Technology, 2015, 2015 14th International Conference on Information Technology, IEEE, pp. 200-205 (Year: 2015).*

International Search Report (including English translation) and Written Opinion issued in PCT/CN2019/118591, dated Feb. 1, 2020, 9 pages.

* cited by examiner

SYSTEM AND METHOD FOR IDENTIFYING PRODUCT INFORMATION

CROSS-REFERENCE TO RELATED APPLICATIONS

This application is based upon and claims the priority of PCT patent application No. PCT/CN2019/118591 filed on Nov. 14, 2019 which claims priority to the Chinese patent application No. 201811358895.0 filed on Nov. 15, 2018, the entire content of all of which is hereby incorporated by reference herein for all purposes.

TECHNICAL FIELD

The present disclosure relates to a field of information identification, and particularly relates to identification of different lamp products.

BACKGROUND

For the existing smart lamp devices, after the lamp devices are installed, when searching on an APP of a user, only how many lamps exist can be searched, and the categories of the lamps cannot be identified, which requires an operator to personally identify categories or other information of the lamps, and to distinguish different lamps and lamp information by renaming an icon of the certain lamp in a terminal device, thereby manually identifying the information of the lamp. Apparently, the existing method for installing and debugging the lamp has a relatively low efficiency and increases the labor cost.

SUMMARY

The present disclosure provides a system as well as a method for identifying product information.

According to a first aspect, the present disclosure provides a system for automatically identifying product information comprises a lamp information collection module, a controller, and a user terminal.

The controller has a built-in comparison table setting different power information intervals for different lamp categories, and sends to-be-collected power information to the lamp information collection module; the lamp information collection module is used to collect corresponding power information according to the received to-be-collected power information and send the collected power information to the controller; the controller is further used to determine a category of a lamp according to the collected power information corresponding to the lamp and the power information interval comparison table, and send information of the lamp to the user terminal; and the user terminal comprises a human-machine interface and is used to display the information of the lamp on the human-machine interface.

According to a second aspect, the present disclosure provides a method for automatically identifying product information comprises: setting different power information intervals for different categories of lamps; collecting power information of a drive power corresponding to a lamp; determining a category of the lamp according to the collected power information corresponding to the lamp; and sending the category information of the lamp to a user terminal.

The user terminal comprises a human-machine interface used to display information of the lamp on the human-machine interface, and the category of the lamp is uniquely identified by the different power information intervals corresponding to different lamps.

It is to be understood that both the foregoing general description and the following detailed description are exemplary and explanatory only and are not restrictive of the present disclosure.

BRIEF DESCRIPTION OF THE DRAWINGS

To more clearly describe the technical solutions in examples of the present disclosure, the drawings needed to be used in the description of the examples will be briefly introduced below. Apparently, the following drawings only show some examples of the present disclosure, so for those ordinary skilled in the art, other drawings can also be obtained according to these drawings without contributing creative work.

DETAILED DESCRIPTION

Technical solution and advantages of the examples of the disclosure, the technical solutions of the present disclosure are described in connection with the examples of the present disclosure and the corresponding drawings. The described examples are just a part but not all of the examples of the present disclosure. Based on the examples of the present disclosure, those skilled in the art can obtain other example(s), without any inventive work, which should be within the scope of the disclosure.

It shall be understood that, although the terms "first," "second," "third," and the like may be used herein to describe various information, the information should not be limited by these terms. These terms are only used to distinguish one category of information from another. For example, without departing from the scope of the present disclosure, first information may be termed as second information; and similarly, second information may also be termed as first information. As used herein, the term "if" may be understood to mean "when" or "upon" or "in response to" depending on the context.

The present disclosure is further described below in conjunction with the accompanying drawings.

EXAMPLE 1

Figure 1:
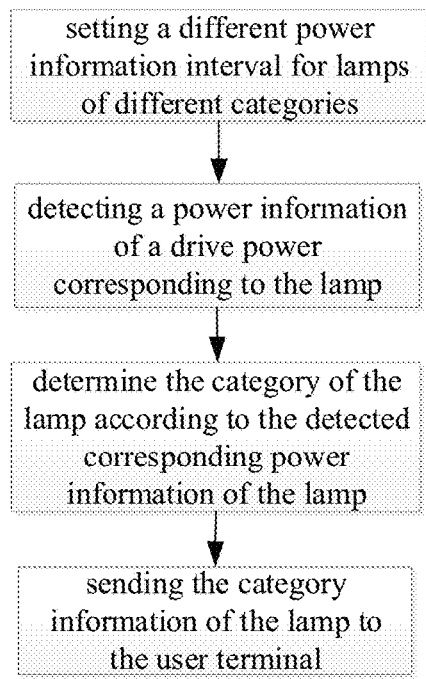
FIG. 1 is a schematic diagram of a preferred method for identifying product information according to the examples of the present disclosure.

FIG. 1 is a schematic diagram of a preferred method for identifying product information according to the examples of the present disclosure. As shown in FIG. 1, the method for identifying the product information specifically includes:

Step 1: setting different power information intervals for different lamp categories. The power information interval is one or a combination of two or more of a voltage interval, a current interval and a frequency interval. The power information intervals corresponding to different lamp categories do not overlap with other. The following table 1 is a voltage interval table corresponding to different categories of lamp devices.

TABLE 1

| No. | Category | Voltage Detection Interval | | |
| --- | --- | --- | --- | --- |
| | | Lower Limit (mV) | Upper Limit (mV) | Mean Value (MOL) |
| 1 | Down Lamp | 0 | 200 | 100 |
| 2 | Spot Lamp | 200 | 400 | 300 |
| 3 | Flat Lamp | 400 | 600 | 500 |
| 4 | Free Stand Lamp | 600 | 800 | 700 |
| 5 | Pendant Lamp | 800 | 1000 | 900 |
| 6 | Track Lamp (Spot Lamp, Linear Lamp) | 1000 | 1200 | 1100 |
| 7 | Luminous Tube | 1200 | 1400 | 1300 |
| 8 | Concealed Slot Lamp | 1400 | 1600 | 1500 |
| 9 | String Lamp | 1600 | 1800 | 1700 |
| 10 | Low Ceiling Lamp | 1800 | 2000 | 1900 |
| 11 | Wall Washer Lamp | 2000 | 2200 | 2100 |
| 12 | Lamp Holder | 2200 | 2400 | 2300 |
| 13 | High Ceiling Lamp | 2400 | 2600 | 2500 |
| 14 | Tri-proof Lamp | 2600 | 2800 | 2700 |
| 15 | To be determined | 2800 | 3000 | 2900 |
| 16 | To be determined | 3000 | 3200 | 3100 |

As shown in table 1, the voltage intervals corresponding to different categories of lamps do not overlap with each other. For example, the voltage interval of the luminous tube of the seventh category is 1200-1400, the voltage interval of the concealed slot lamp of the adjacent eighth category is 1400-1600, and the voltage intervals of the two do not overlap, thus ensuring that in the subsequent collection process, the situation that a same voltage value falls within two overlapping voltage intervals does not occur, thereby improving the efficiency of the subsequent collection.

The following table 2 is a current interval table corresponding to different categories of lamp devices:

TABLE 2

| No. | Category | Current Detection Interval | | |
| --- | --- | --- | --- | --- |
| | | Lower limit (mA) | Upper Limit (mA) | Mean Value (MOL) |
| 1 | Down Lamp | 0 | 20 | 10 |
| 2 | Spot Lamp | 20 | 40 | 30 |
| 3 | Flat Lamp | 40 | 60 | 50 |
| 4 | Free Stand Lamp | 60 | 80 | 70 |
| 5 | Pendant Lamp | 80 | 100 | 90 |
| 6 | Track Lamp (Spot Lamp, Linear Lamp) | 100 | 120 | 110 |
| 7 | Luminous Tube | 120 | 140 | 130 |
| 8 | Concealed Slot Lamp | 140 | 160 | 150 |
| 9 | String Lamp | 160 | 180 | 170 |
| 10 | Low Ceiling Lamp | 180 | 200 | 190 |
| 11 | Wall Washer Lamp | 200 | 220 | 210 |
| 12 | Lamp Holder | 220 | 240 | 230 |
| 13 | High Ceiling Lamp | 240 | 260 | 250 |
| 14 | Tri-proof Lamp | 260 | 280 | 270 |
| 15 | To be determined | 280 | 300 | 290 |
| 16 | To be determined | 300 | 320 | 310 |

As shown in table 2, the current intervals corresponding to different categories of lamps do not overlap with each other. For example, the current detection interval of the string lamp of the ninth category is 160 mA-180 mA, the current detection interval of the lower ceiling lamp of the tenth category is 180 mA-200 mA, the current detection interval of the wall washer lamp of the eleventh category is 200 mA-220 mA, and the current intervals of the three do not overlap, thus ensuring that in the subsequent collection process, the situation that a same current value falls within two overlapping current intervals do not occur, thereby improving the efficiency of the subsequent collection.

The following table 3 is a frequency signal interval table corresponding to different categories of lamp devices:

TABLE 3

| No. | Category | Frequency Signal Detection Interval | | |
| --- | --- | --- | --- | --- |
| | | Lower Limit (Hz) | Upper Limit (Hz) | Mean Value (MOL) |
| 1 | Down Lamp | 0 | 200 | 100 |
| 2 | Spot Lamp | 200 | 400 | 300 |
| 3 | Flat Lamp | 400 | 600 | 500 |
| 4 | Free Stand Lamp | 600 | 800 | 700 |
| 5 | Pendant Lamp | 800 | 1000 | 900 |
| 6 | Track Lamp (Spot Lamp, Linear Lamp) | 1000 | 1200 | 1100 |
| 7 | Luminous Tube | 1200 | 1400 | 1300 |
| 8 | Concealed Slot Lamp | 1400 | 1600 | 1500 |
| 9 | String Lamp | 1600 | 1800 | 1700 |
| 10 | Low Ceiling Lamp | 1800 | 2000 | 1900 |
| 11 | Wall Washer Lamp | 2000 | 2200 | 2100 |
| 12 | Lamp Holder | 2200 | 2400 | 2300 |
| 13 | High Ceiling Lamp | 2400 | 2600 | 2500 |
| 14 | Tri-proof Lamp | 2600 | 2800 | 2700 |
| 15 | To be determined | 2800 | 3000 | 2900 |
| 16 | To be determined | 3000 | 3200 | 3100 |

As shown in table 3, the frequency signal intervals corresponding to different categories of lamps do not overlap. Therefore, it is ensured that in the subsequent collection process, the situation that a same frequency signal value falls within two overlapping frequency signal intervals may not occur, thereby improving the subsequent collection efficiency.

Besides the above non-overlapping setting of the voltage interval, the current interval and the frequency signal interval, the interval values may also be allowed to partially overlap with each other. In the subsequent collection process, it is possible that the collected voltage value falls within two adjacent voltage intervals at the same time. In this situation, different devices cannot be distinguished only by voltage, and the category of the lamp shall be determined by further comprehensively considering which interval the current value falls within and/or which interval the frequency signal value falls within.

Step 2: collecting the power information of a drive power corresponding to the lamp. In accordance with the power information set in the step 1, the corresponding power information is collected. For example, in the case where the voltage interval is set in the step 1, only the voltage is collected in the step 2; in the case where the frequency interval is set in the step 1, only the frequency is collected in the step 2; and in the case where the voltage interval and the current interval are set in the step 1, the voltage and the current are both collected. In the case where the voltage is collected, a resistor voltage division circuit is used for collection. In the case where the frequency is collected, a frequency generation circuit is used for collection.

Step 3, determining the category of the lamp according to the collected power information corresponding to the lamp. Which category of the lamp in the table the lamp belongs to is determined by comparing the collected power information corresponding to the lamp with the power information table set for different lamp categories in the step 1.

Step 4, sending the category information of the lamp to a user terminal. The category information of the lamp is sent to the user terminal. After the lamp is powered on, the category of the lamp can be rapidly identified by the user on the user terminal, so that a complex process of manually naming and identifying the category of the lamp can be avoided. The user terminal may be operated by operating an APP of a mobile phone. In one or more examples, the user terminal invokes a preset mapping table of lamp category information and icons according to the received category information of the lamp and displays the category name of the lamp and the icon marking the lamp on a human-machine interface. The mapping table of lamp category information and icons includes category names and category icons of the lamps.

Besides the category information of the lamp sent to the user terminal, the information sent to the user terminal may also include power consumption, a network distribution state, a fault state of the lamp, etc., so that the user can rapidly complete network distribution of the product, scene setting and other function configurations in the installation and use process and understand the operation condition of the product in real time.

EXAMPLE 2

Figure 2:
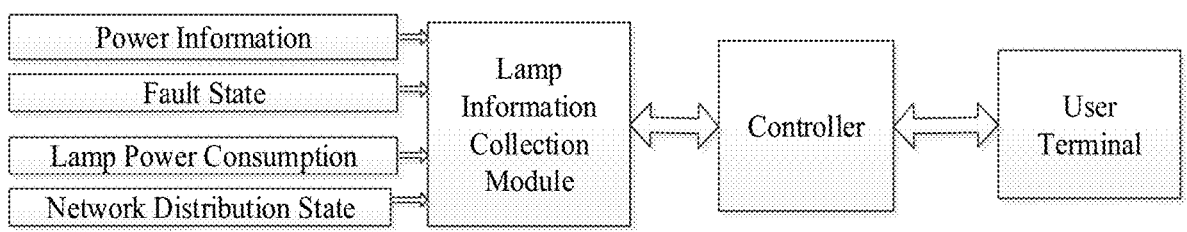
FIG. 2 is a schematic diagram of a preferred system for identifying product information according to the examples of the present disclosure.

FIG. 2 is a schematic diagram of a preferred system for identifying product information according to the examples of the present disclosure. As shown in FIG. 2, the system for identifying the product information includes a lamp information collection module, a controller and a user terminal.

The controller is used to set different power information intervals for different lamp categories. The power information interval is one or a combination of more of a voltage interval, a current interval and a frequency interval. One power information interval or the combination of more power information intervals can be used to distinguish different categories of lamps.

Table 1 is a voltage interval table corresponding to different categories of lamp devices. As shown in table 1, the voltage intervals corresponding to different categories of lamps do not overlap with each other. For example, the voltage interval of the luminous tube of the seventh category is 1200-1400, the voltage interval of the concealed slot lamp of the adjacent eighth category is 1400-1600, and the voltage intervals of the two do not overlap, thus ensuring that in the subsequent collection process, the situation that a same voltage value falls within two overlapping voltage intervals do not occur, thereby improving efficiency of the subsequent collection.

Table 2 is a current interval table corresponding to different categories of lamp devices. As shown in table 2, the current intervals corresponding to different categories of lamps do not overlap. For example, the current detection interval of the string lamp of the ninth category is 160 mA-180 mA, the current detection interval of the lower ceiling lamp of the tenth category is 180 mA-200 mA, the current detection interval of the wall washer lamp of the eleventh category is 200 mA-220 mA, and the current intervals of the three do not overlap, thus ensuring that in the subsequent collection process, the situation that a same current value falls within the two overlapping current intervals may not occur, thereby improving the subsequent collection efficiency.

Table 3 is a frequency signal interval table corresponding to different categories of lamp devices. As shown in table 3, the frequency signal intervals corresponding to different categories of lamps do not overlap. Therefore, it is ensured that in the subsequent collection process, the situation that a same frequency signal value falls within two overlapping frequency signal intervals do not occur, thereby improving efficiency of the subsequent collection.

Besides the above non-overlapping setting of the voltage interval, the current interval and the frequency signal interval, the interval values may also be allowed to partially overlap with each other. In the subsequent collection process, it is possible that the collected voltage value may fall within two adjacent voltage intervals at the same time. In this situation, different devices cannot be distinguished only by voltage, and the category of the lamp shall be determined by comprehensively considering which interval the current value falls within and/or which interval the frequency signal value falls within.

After finishing setting the power information intervals, the controller regularly sends a request message of to-be-collected power information to the lamp information collection module connected with the controller in the lamp. For example, in the case where the controller only sets a voltage interval table, only the request message for collecting the voltage information needs to be sent to the lamp information collection module. In the case where the controller sets both a voltage interval table and a frequency interval table, the request message for collecting the voltage information and the frequency information need to be sent to the lamp information collection module. The controller sends the message to the lamp information collection module in a wired or wireless manner.

The lamp information collection module collects the power information of the drive power corresponding to the lamp after receiving the request message of the to-be-collected power information sent by the controller. In accordance with the power information in the request message, the corresponding power information is collected. For example, in the case where the voltage interval is set in the request message, only the voltage is collected; in the case where the frequency interval is set in the request message, only the frequency is collected; and in the case where the voltage interval and the current interval are set in the request message, both the voltage and the current are collected. In the case where the voltage is collected, a resistor voltage division circuit in the lamp information collection module is used for collection. In the case where the frequency is collected, a frequency generation circuit in the lamp information collection module is used for collection.

The lamp information collection module can be used to collect power consumption information, a network distribution state and a fault state information of the lamp besides the power information.

After collecting the information, the lamp information collection module sends the collected information to the controller in a wired or wireless manner.

After receiving the collected information sent by the lamp information collection module, the controller determines the category of the lamp according to the collected power information corresponding to the lamp. The collected power information corresponding to the lamp is compared with the power information interval table to determine which lamp category in the table the lamp belongs to.

The controller converts the category information of the lamp and other information such as the power consumption, the network distribution state, the fault state and the like into a communication instruction and sends the communication instruction to the user terminal through Bluetooth or a wireless module. The user terminal invokes and displays different contents and icons on a design interface of the control terminal according to the uploaded communication instruction. In one or more examples, the user terminal invokes a preset mapping table of lamp category information and icons according to the received category information of the lamp, and displays the category name of the lamp and the icon marking the lamp on a human-machine interface. The mapping table of lamp category information and icons includes the category name and the category name of the lamp. The information of the lamp (the information of the lamp contains the category icon of the lamp, the power consumption of the lamp, the network distribution state and the like) can be automatically displayed the first time when the user terminal receives the information of the lamp, so as to facilitate the user to rapidly complete the product network distribution, scene setting and other function configurations in the installation and use process, and know the opertion condition of the product in real time.

The present disclosure provides a system and a method for automatically identifying product information.

At a first aspect, an example of the present disclosure provides a system for automatically identifying product information comprises a lamp information collection module, a controller, and a user terminal. The controller has a built-in comparison table setting different power information intervals for different lamp categories, and sends to-be-collected power information to the lamp information collection module; the lamp information collection module is used to collect corresponding power information according to the received to-be-collected power information and send the collected power information to the controller; the controller is further used to determine a category of a lamp according to the collected power information corresponding to the lamp and the power information interval comparison table, and send information of the lamp to the user terminal; and the user terminal comprises a human-machine interface and is used to display the information of the lamp on the human-machine interface.

In one example mode, the power information interval comprises one or more of following information: a voltage interval, a current interval, and a frequency interval.

In one example mode, when the power information interval is one of the voltage interval, the current interval and the frequency interval, ranges of the power information interval do not overlap with each other.

In one example mode, the information collected by a lamp information collection MCU further comprises power consumption information, a network distribution state, and a fault state of the lamp, and the information collected is sent to the controller together.

In one example mode, the controller sends the information of the lamp to the user terminal comprises: the controller converts the information of the lamp into a communication instruction and sends the communication instruction to the user terminal through Bluetooth or a wireless module.

In one example mode, the controller sends a request message of the to-be-collected power information to the lamp information collection module comprises: the controller regularly sends the request message of the to-be-collected power information to the lamp information collection module in the lamp.

In one example mode, the lamp information collection module and the controller are communicated in a wired or wireless manner.

In one example mode, the user terminal is used to display the information of the lamp on the human-machine interface comprises: the user terminal invokes a preset mapping table of lamp category information and icons according to received category information of the lamp and displaying a category name of the lamp and an icon marking the lamp on the human-machine interface.

At a first aspect, an example of the present disclosure provides a method for automatically identifying product information comprises: setting different power information intervals for different categories of lamps; collecting power information of a drive power corresponding to a lamp; determining a category of the lamp according to the collected power information corresponding to the lamp; and sending the category information of the lamp to a user terminal. The user terminal comprises a human-machine interface used to display information of the lamp on the human-machine interface, and the category of the lamp is uniquely identified by the different power information intervals corresponding to different lamps.

In one example mode, the power information intervals comprise one or more of following information: a voltage interval, a current interval, and a frequency interval.

In one example mode, when a power information interval is one of the voltage interval, the current interval and the frequency interval, and ranges of the power information interval do not overlap with each other.

In one example mode, during collecting the power information of the drive power corresponding to the lamp, information comprising at least power consumption, a network distribution state and a fault state of the lamp is also collected; and the information is sent to the controller together.

In one example mode, sending the category information of the lamp to the user terminal comprises: converting the information of the lamp into a communication instruction and sending the communication instruction to the user terminal through Bluetooth or a wireless module.

In one example mode, the user terminal is used to display the information of the lamp on the human-machine interface comprises: the user terminal invokes a preset mapping table of lamp category information and icons according to received category information of the lamp and displaying a category name of the lamp and an icon marking the lamp on the human-machine interface.

Beneficial effects of the present disclosure comprises: the method and the system for identifying product information provided by the present disclosure can facilitate the user to know about the category and the operation state of the lamp product in real time during the installing and the using of the lamp, and quickly complete network distribution of the product, scene setting and other function configurations according to the above information, so that the installation and configuration efficiency is improved.

The present disclosure may include dedicated hardware implementations such as application specific integrated circuits, programmable logic arrays and other hardware devices. The hardware implementations can be constructed to implement one or more of the methods described herein. Examples that may include the apparatus and systems of various implementations can broadly include a variety of electronic and computing systems. One or more examples described herein may implement functions using two or more specific interconnected hardware modules or devices with related control and data signals that can be communicated between and through the modules, or as portions of an application-specific integrated circuit. Accordingly, the system disclosed may encompass software, firmware, and hardware implementations. The terms "module," "sub-module," "circuit," "sub-circuit," "circuitry," "sub-circuitry," "unit,"

What is claimed is:

1. A system for automatically identifying product information, comprising:
   a lamp information collection circuit;
   a controller; and
   a user terminal;
   wherein the controller has a built-in power information interval comparison table setting different intervals for different lamp categories, and sends to-be-collected power information to the lamp information collection circuit;
   the lamp information collection circuit is used to collect corresponding power information according to the received to-be-collected power information and send the collected power information to the controller;
   the controller is further used to determine a category of a lamp according to the collected power information corresponding to the lamp and the power information interval comparison table, and send information of the lamp to the user terminal; and
   the user terminal comprises a human-machine interface and is used to display the information of the lamp on the human-machine interface;
   wherein, a power information interval comprises one of a voltage interval, a current interval, or a frequency interval, and ranges of the power information interval do not overlap with each other.

2. The system according to claim 1, wherein the information collected by a lamp information collection MCU further comprises power consumption information, a network distribution state, and a fault state of the lamp, and the information collected is sent to the controller together.

3. The system according to claim 2, wherein the controller converts the information of the lamp into a communication instruction and sends the communication instruction to the user terminal through Bluetooth or a wireless circuit.

4. The system according to claim 1, wherein:
   the controller sends a request message of the to-be-collected power information to the lamp information collection circuit; and
   the controller regularly sends the request message of the to-be-collected power information to the lamp information collection circuit in the lamp.

5. The system according to claim 3, wherein the lamp information collection circuit and the controller are communicated in a wired or wireless manner.

6. The system according to claim 5, wherein the user terminal invokes a preset mapping table of lamp category information and icons according to received category information of the lamp and displaying a category name of the lamp and an icon marking the lamp on the human-machine interface.

7. A method for automatically identifying product information, comprising:
   setting different power information intervals for different categories of lamps;
   collecting power information of a drive power corresponding to a lamp;
   determining a category information of the lamp according to the collected power information corresponding to the lamp;
   sending information of the lamp to a user terminal,
   providing the user terminal with a human-machine interface, and displaying the information of the lamp on the human-machine interface; and
   uniquely identifying the information of the lamp by using the different power information intervals corresponding to different lamps;
   wherein, a power information interval comprises one of a voltage interval, a current interval, or a frequency interval, and ranges of the power information interval do not overlap with each other.

8. The method according to claim 7, wherein, when collecting the power information of the drive power corresponding to the lamp, the power information comprises at least power consumption, and a network distribution state and a fault state of the lamp are also collected; and the power information is sent to the controller.

9. The method according to claim 8, wherein sending the category information of the lamp to the user terminal comprises:
   converting the information of the lamp into a communication instruction and sending the communication instruction to the user terminal through Bluetooth or a wireless circuit.

10. The method according to claim 9, wherein displaying the information of the lamp on the human-machine interface comprises:
    invoking, by the user terminal, a preset mapping table of lamp category information and icons according to received category information of the lamp and displaying a category name of the lamp and an icon marking the lamp on the human-machine interface.

* * * * *